US012586764B2

(12) United States Patent
Chen et al.

(10) Patent No.: US 12,586,764 B2
(45) Date of Patent: Mar. 24, 2026

(54) PLASMA SHOWERHEAD TREATMENT METHODS

(71) Applicant: Applied Materials, Inc., Santa Clara, CA (US)

(72) Inventors: Hanhong Chen, Milpitas, CA (US); Zhejun Zhang, Santa Clara, CA (US); Chi-Chou Lin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 18 days.

(21) Appl. No.: 18/425,675

(22) Filed: Jan. 29, 2024

(65) Prior Publication Data

US 2025/0246411 A1      Jul. 31, 2025

(51) Int. Cl.
*H01J 37/32* (2006.01)
*H01L 21/02* (2006.01)
(52) U.S. Cl.
CPC .... *H01J 37/3244* (2013.01); *H01J 37/32201* (2013.01); *H01L 21/02274* (2013.01)
(58) Field of Classification Search
CPC .. C23C 16/4404; C23C 16/345; C23C 16/402
See application file for complete search history.

(56) References Cited

U.S. PATENT DOCUMENTS

| | | | |
|---|---|---|---|
| 9,758,869 B2 | 9/2017 | Choi et al. | |
| 2007/0281083 A1* | 12/2007 | Lakshmanan | C23C 16/4405 |
| | | | 427/248.1 |
| 2008/0242116 A1* | 10/2008 | Clark | H01L 21/3185 |
| | | | 438/791 |
| 2009/0071407 A1* | 3/2009 | Kuznetsov | C30B 35/002 |
| | | | 118/728 |
| 2010/0099271 A1* | 4/2010 | Hausmann | C23C 16/402 |
| | | | 438/778 |
| 2011/0018443 A1* | 1/2011 | Kou | H05H 1/46 |
| | | | 315/111.21 |
| 2012/0318457 A1 | 12/2012 | Nguyen et al. | |
| 2023/0317416 A1 | 10/2023 | Wang et al. | |

* cited by examiner

*Primary Examiner* — Alex A Rolland
(74) *Attorney, Agent, or Firm* — Servilla Whitney LLC

(57) ABSTRACT

Methods of treating a plasma showerhead comprise placing a showerhead comprising a faceplate and a plurality of gas openings PECVD substrate processing chamber having a process volume between the substrate support and the faceplate, and then exposing the showerhead to a silicon-containing precursor and a reactant gas so that the process volume and the gas openings are filled with the silicon-containing precursor and the reactant gas. The method includes introducing a first plasma in the PECVD substrate processing chamber to form a silicon oxide thin film or a silicon nitride thin film on the lower surface of the faceplate and lining the gas openings. A precursor-removing purge gas is flowed and a second plasma is struck to densify the thin film.

15 Claims, 3 Drawing Sheets

PLASMA SHOWERHEAD TREATMENT METHODS

TECHNICAL FIELD

Embodiments of the disclosure generally relate to the field of semiconductor device manufacturing. More particularly, embodiments of the disclosure are directed to methods of treating plasma showerheads used in the manufacture of semiconductor devices.

BACKGROUND

The semiconductor processing industry continues to strive for larger production yields while increasing the uniformity of layers deposited on substrates having larger surface areas. As circuit integration increases, the need for greater uniformity and process control of layer thickness rises.

Chemical vapor deposition (CVD) is one of the most common deposition processes employed for depositing layers on substrates. CVD involves control of the substrate temperature and the precursors to produce a desired layer of uniform thickness. Cyclical deposition or atomic layer deposition (ALD) involves sequential delivery of precursor molecules on a substrate surface. In one example, an ALD cycle includes exposing the substrate surface to a first precursor, a first purge gas, a second precursor, and a first purge gas. The first and second precursors react to form a product compound as a layer (or film) on the substrate surface. The cycle is repeated to form the film to a desired thickness. CVD and ALD methods to deposit silicon oxide and silicon nitride ($Si_xN_y$) films on a substrate such as a semiconductor wafer are performed in a substrate processing chamber. Precursor and/or reactant gases may be flowed through a showerhead having a plurality of gas openings through which the gases flow.

Plasma-enhanced ALD (PEALD) silicon nitride ($Si_xN_y$) films are used in many semiconductor applications to improve film quality provided by low temperature thermal processes. A plasma is formed in the substrate processing chamber. The precursor and/or reactant gases that flow through a showerhead react with the plasma to deposit a thin layer or film of material on the surface of the substrate that is positioned on a substrate support. Some PEALD substrate processing chambers use capacitive plasma sources in RF/VHF frequency band up to several tens of MHz, for example at 13.6 MHz or 60 MHz. Capacitive plasmas have moderate plasma densities and can have relatively high ion energies. On the other hand, microwave plasmas operating at frequencies at greater than 300 MHz, for example, 2.45 GHZ, and have very high charge and plasma densities compared to capacitive plasma sources. The typical plasma densities can be one or two order higher than RF plasma and ion energies can be as low as less than 10 eV. Such plasma features are becoming increasingly important to deposit high quality films at lower wafer temperature in damage-free processing of modern silicon devices.

Existing shower heads used in high charge and plasma densities such as microwave plasma contribute to defect and particle generation. There is a need to provide improved processes to treat plasma showerheads with thinner coating inside gas openings that prevent particle and defects generation from gas openings in higher plasma density PEALD deposition processes, in particular processes that utilize microwave plasmas.

SUMMARY

One or more embodiments of the disclosure are directed to a method of treating a plasma showerhead. The method comprises placing a showerhead comprising a faceplate having a lower surface and a plurality of gas openings in the faceplate in a plasma processing chamber above a substrate support so that there a space defining a process volume between the substrate support and the faceplate; exposing the showerhead comprising the faceplate and the plurality of gas openings to a silicon-containing precursor and a reactant gas containing one of oxygen and nitrogen so that the process volume and the gas openings are filled with the silicon-containing precursor and the reactant gas; introducing a first plasma in the plasma processing chamber for a time sufficient to form a thin film selected from the group consisting of a silicon oxide thin film and a silicon nitride thin film on the lower surface of the faceplate and lining the gas openings; flowing a precursor-removing purge gas to remove the silicon-containing precursor from the process volume and the gas openings; and introducing a second plasma in the plasma processing chamber after flowing the purge gas to remove the silicon-containing precursor from the process volume and the gas openings, wherein introducing the second plasma densifies the thin film.

In one or more embodiments, the thin film comprises silicon oxide. In other embodiments, the thin film comprises silicon nitride. In one or more embodiments, introducing the first plasma and/or the second plasma comprises introducing a microwave plasma.

The microwave plasma operates at frequencies at greater than 300 MHz and less than 30 GHZ, for example, 2.45 GHz, and have very high charge and plasma densities compared to capacitive plasma sources. The plasma densities in some embodiments range from $10^{12}/cm^3$ to $10^{13}/cm^3$ and ion energies in some embodiments are less than10 eV.

In another embodiment, a method of treating a plasma showerhead comprises placing a showerhead comprising a faceplate having a lower surface and a plurality of gas openings in the faceplate in a plasma processing chamber above a substrate support so that there is a space defining a process volume between the substrate support and the faceplate; exposing the showerhead comprising the faceplate and the plurality of gas openings to a gas mixture comprising a silicon-containing precursor at a gas concentration and a reactant gas containing one or more of oxygen and nitrogen so that the process volume and the gas openings are filled with the silicon-containing precursor and the reactant gas; flowing a concentration-reducing purge gas for a first period of time to reduce the concentration of the silicon-containing precursor in the gas openings; introducing a first microwave plasma in the plasma processing chamber for a time sufficient to form a silicon oxide thin film on the lower surface of the faceplate and lining the gas openings; flowing a precursor-removing purge gas for a second period of time longer than the first period of time to remove the silicon-containing precursor from the process volume and the gas openings; and introducing a second plasma in the plasma processing chamber to densify the thin film on the lower surface of the faceplate and lining the gas openings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of the present disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
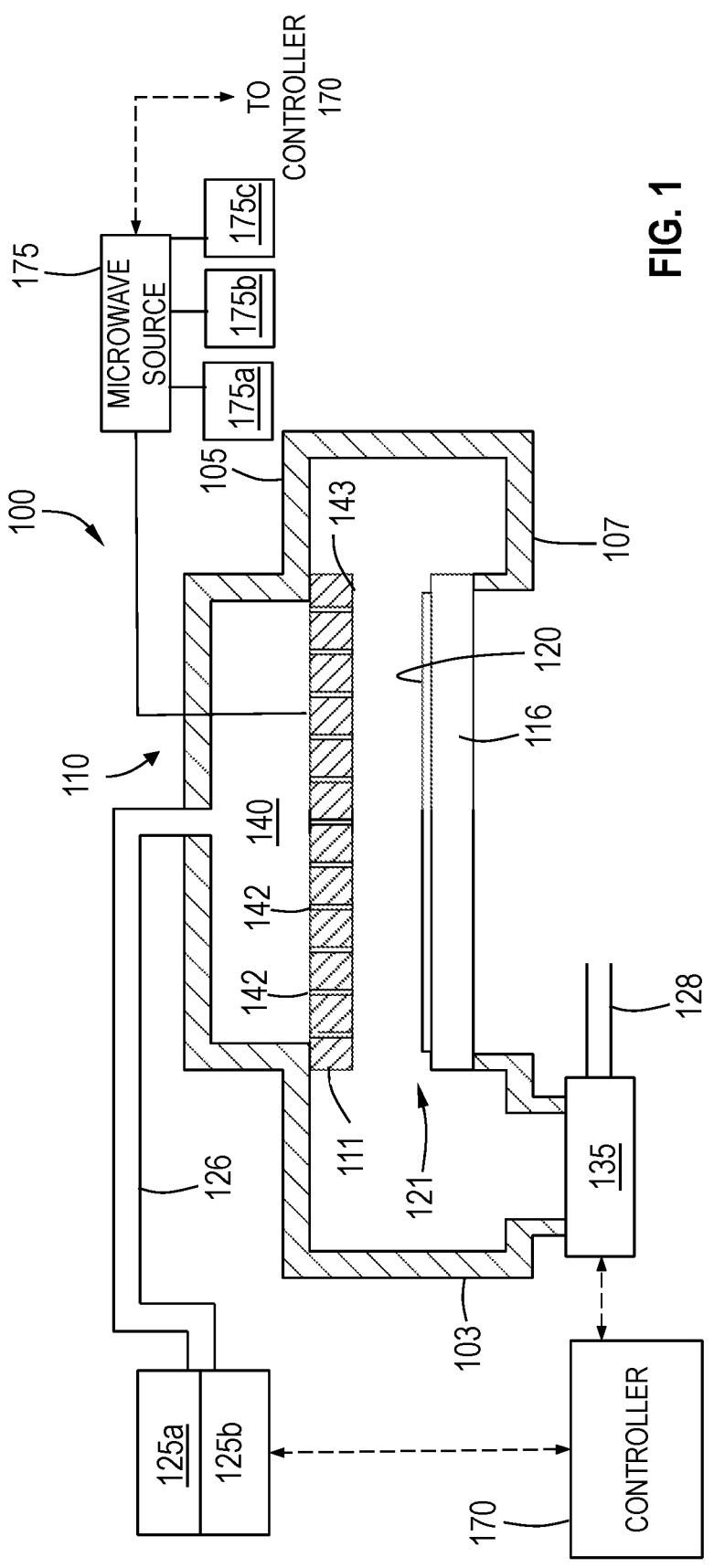
FIG. 1 illustrates a sectional view of a plasma chamber assembly according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±2%, ±1%, ±0.5%, or ±0.1%.

Spatially relative terms, such as "beneath," "below," "lower," "above," "upper" and the like, may be used herein for ease of description to describe one element or feature's relationship to another element(s) or feature(s) as illustrated in the Figures. It will be understood that the spatially relative terms are intended to encompass different orientations of a device in use or operation in addition to the orientation depicted in the figures. For example, if the device in the Figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as a metallic material, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a first purge gas, such as argon or nitrogen, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., hydrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. As used herein, the term "thermal process(es)" refers to a deposition technique that does not involve the use of plasma. As used herein, the term "plasma" refers to a composition having ionically charged species and uncharged neutral and radical species.

Plasma-enhanced atomic layer deposition (PEALD) methods add a plasma exposure to traditional ALD methods. In some PEALD methods, a nitrogen source is provided as the plasma. PEALD methods provide for a relatively low substrate temperature, e.g., less than or equal to 600° C., during processing. PEALD may also utilize a single plasma exposure to perform both a precursor-nitrogen reaction step and a film treatment or densification step.

Embodiments of the disclosure are directed to methods of depositing silicon oxide or silicon nitride ($Si_xN_y$) films by plasma-enhanced chemical vapor deposition (PECVD) on a showerhead, in particular the faceplate and gas openings extending through to the faceplate. The skilled artisan will recognize that the use of a molecular formula such as $Si_xN_y$ does not imply specific stoichiometric relation between the elements but merely the identity of the major components of the film. In some embodiments, the major composition of the specified film (i.e., the sum of the atomic percent of the specified atoms) is greater than or equal to about 95%, 98%, 99%, 99.5%, or 99.9% of the film, on an atomic basis. In one or more embodiments, the silicon nitride ($Si_xN_y$) film comprises $Si_3N_4$.

Embodiments of the disclosure advantageously provide methods of treating a showerhead by depositing a silicon nitride ($Si_xN_y$) film or a silicon oxide film on at least the lower surface of a faceplate and in the gas openings of a showerhead. The thin film deposited according to one or more embodiments described herein has improved film quality and a controlled thickness. Some embodiments advantageously provide methods of depositing improved quality silicon nitride ($Si_xN_y$) and silicon oxide films that are useful for showerheads that are used in PECVD and PEALD chambers that utilize high density microwave plasma. In addition to the lower surface of the faceplate and the gas openings, other portions of the showerhead may be treated by depositing the thin film for example on the plenum and the entire outside surface of the showerhead that is exposed to a plasma chamber.

Showerheads used in microwave plasma processes are comprised of a dielectric faceplate and a plurality of gas openings in the faceplate. The faceplate is made from dielectric materials such as alumina (AlOx), quartz (SiOx) and aluminum nitride (AlN). The dielectric faceplate may contain metal impurities such as Mg, Cu, and Fe. Exposing the dielectric faceplate directly to microwave plasma causes metal contaminants such as Al, Mg, Cu, and Fe to form in the substrate processing chamber. In existing showerheads, a layer of plasma-enhanced CVD (PECVD) silicon dioxide ($SiO_2$) or silicon nitride ($Si_xN_y$) is coated on the lower surface of the faceplate and lining the gas openings in the faceplate in an effort to reduce metal contamination. Plasma showerheads that are used in microwave plasma processes that utilize higher plasma densities are prone to plasma lightup inside gas openings in the faceplate. Because of high plasma density inside the gas openings, it was found that with existing processes, a thick coating is formed inside the gas openings using conventional PECVD coating processes, which utilizes a constant flow of a Si-containing precursor (e.g., $SiH_4$) and a reactant gas containing oxygen (e.g., $O_2$) or nitrogen (e.g., $N_2$) to form a coating that covers the faceplate of the showerhead and the gas openings in the faceplate. It was determined that the thick PECVD SiN or SiOx inside the gas openings generates particles and defects during high plasma density PEALD processes and causes yield loss in the manufacture of semiconductor devices. Embodiments of the disclosure advantageously provide improved processes to treat plasma showerheads by depositing a thinner layer of a thin film inside gas openings compared to existing processes, which prevents particle and defect generation from gas openings in higher plasma density PEALD deposition processes, in particular, processes that utilize microwave plasmas.

The embodiments of the disclosure are described by way of the Figures, which illustrate processes and apparatuses in accordance with one or more embodiments of the disclosure. The processes and resulting showerheads shown are merely illustrative of the disclosed processes, and the skilled artisan will recognize that the disclosed processes are not limited to the illustrated embodiments.

In the following description, numerous specific details are set forth in order to provide a thorough understanding of the embodiments of the disclosure. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

FIG. 1 is a sectional view of a plasma processing chamber 100. The plasma processing chamber 100 has a sidewall 103, a top wall 105, and a bottom wall 107 which enclose a process volume 121. A substrate pedestal 116, which supports a substrate 120, mounts to the bottom wall 107 of the plasma processing chamber 100. In certain embodiments, the substrate pedestal 116 is heated and/or cooled by use of embedded heat transfer fluid lines (not shown), or an embedded thermoelectric device (not shown), to improve the plasma process results on the substrate 120 surface. A vacuum pump 135 controls the pressure within the plasma processing chamber 100, at a pressure in a range of from 0.5 Torr to about 10 Torr, for example from about 0.5 Torr to 5 Torr. A showerhead 110 configured to distribute gases into the process volume 121 comprises a gas distribution plenum 140 connected to a process gas supply 125a and a reactive gas supply 125b via a gas supply line 126. While one gas supply line 126 is shown in FIG. 1, more than one gas supply line 126 can be utilized to separately deliver a process gas from the process gas supply 125a and the reactive gas supply 126b. The process gas delivered from the process gas supply 125a and the reactive gas delivered from the reactive gas supply 126b flow through the gas distribution plenum 140 and a plurality of gas openings 142 in a faceplate 111 of the showerhead 110 to the process volume 121. In one or more embodiments, the showerhead 110 is made from a metal or ceramic material (e.g., anodized aluminum or aluminum oxide). An exhaust line 128 is configured to remove reaction byproducts from the plasma processing chamber 100.

In certain embodiments, the microwave source 175 may include microwave amplification circuitry 175a. In some embodiments, a voltage control circuit 175b provides an input voltage to a voltage controlled oscillator 175c configured to produce microwave radiation at a desired frequency that is transmitted to the solid state microwave amplification circuitry 130 in the microwave source 175. After processing by the microwave amplification circuitry 130, the microwave radiation is transmitted to the gas distribution plenum 140. A controller 170 is configured to control the microwave source 175, including the microwave amplification circuitry 175a and the voltage control circuit 175b, and the PECVD process to apply a thin film to the showerhead 110 as detailed further below. The controller 170 is further configured to control operation of the vacuum pump 135, delivery of the process gas and the reactive gas from the process gas supply 125a and the reactive gas supply 125b.

Figure 2:
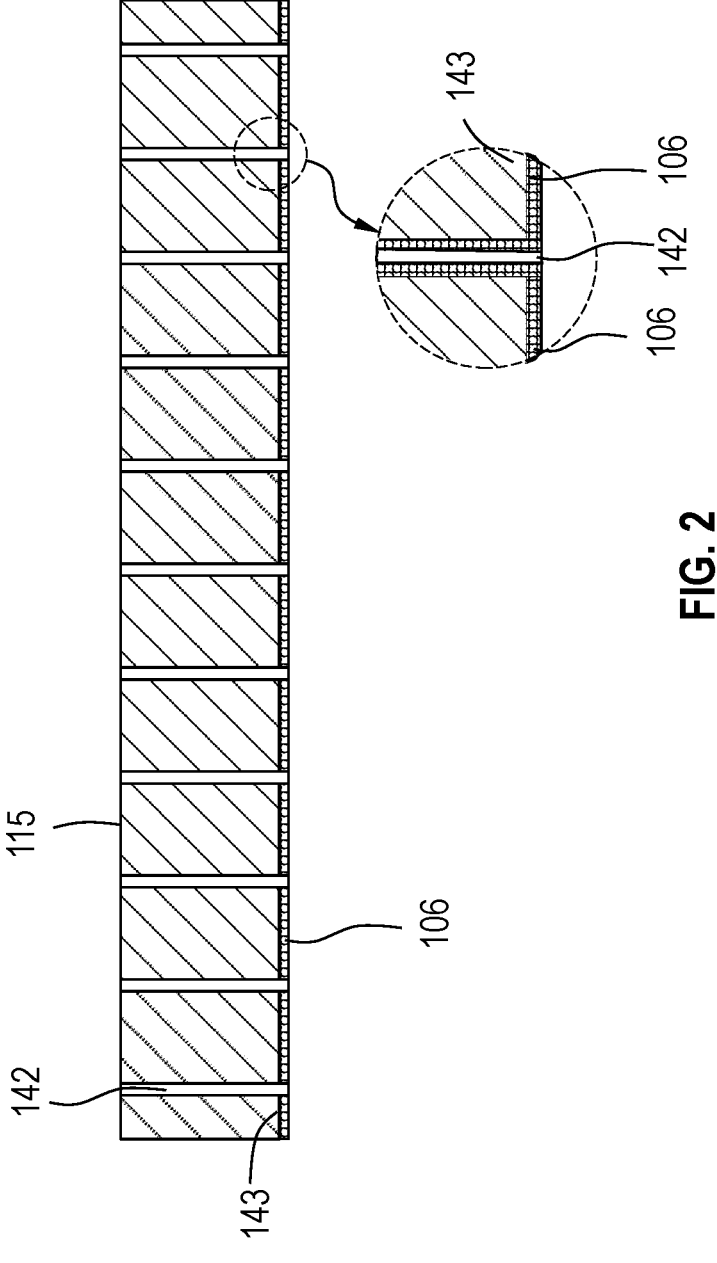
FIG. 2 illustrates a sectional view of a showerhead used in the plasma chamber assembly of FIG. 1.

FIG. 2 is a sectional view of an exemplary embodiment of the showerhead 110 that has been treated according to one or more embodiments. As shown in FIG. 2, the faceplate comprises an upper surface 115 and a lower surface 143. A plurality of gas openings 142 extend through the faceplate 143 from the lower surface 143 to the upper surface 115. In certain embodiments, a thin film 106 is disposed on the lower surface 143 of the showerhead 110. While not shown in FIG. 2, the thin film 106 is also disposed in the gas openings 142. The thin film 106 can be applied before final assembly of the plasma processing chamber 100. The thin film 106 can also be applied to other parts of the showerhead 110 and the gas distribution plenum 140. In certain embodiments, the thin film 106 can be applied to the lower surface 143 of the showerhead 110 after final assembly of the plasma processing chamber 100. Optionally, the thin film 106 can be applied to other aluminum surfaces within the plasma processing chamber 100, for example, the plasma processing chamber 100 itself and the substrate pedestal 116. In certain embodiments, it may be necessary to periodically reapply the thin film 106 to the showerhead 110 or other aluminum surfaces. In certain embodiments, aluminum surface is cleaned prior to reapplication of the thin film 106.

In certain embodiments, the thin film 106 comprises a layer of a silicon-containing material such as silicon dioxide ($SiO_2$) or silicon nitride ($Si_xN_y$). As noted above, it was discovered that existing methods of applying a silicon-containing material with a silicon-containing film such as silicon dioxide ($SiO_2$) or silicon nitride ($Si_xN_y$) using a plasma-enhanced CVD (PECVD) process utilizing a constant flow of a silane and a reactant gas containing oxygen (e.g., $O_2$) or nitrogen (e.g., $N_2$) to form a thin film that covers the faceplate of the showerhead and the gas openings could not be utilized in processes that utilize microwave plasma due to issues with metal contamination.

Embodiments of the present disclosure provide a PECVD thin film formation process for forming a uniform thin film inside the gas openings 142 and on the lower surface 143 of the faceplate 111 for use in high density plasma processes such as microwave plasma PECVD and PEALD process, which can meet one or both metal contamination and particle defect requirements. It will be understood that other portions of the showerhead 110 may be treated with thin film, including the gas distribution plenum 140 and any exposed portions of the faceplate 111 that may generate particles or defects in a plasma chamber.

The silicon-containing precursor may be any suitable precursor that includes silicon. In some embodiments, the silicon-containing precursor includes, but is not limited to, one or more of a silane ($Si_xH_y$), a chlorosilane ($Si_xHyCl_z$), or an iodosilane ($Si_xH_yI_z$). In some embodiments, the silicon-containing precursor includes one or more of silane ($SiH_4$), disilane ($Si_2H_6$), chlorosilane ($H_3SiCl$), dichlorosilane ($H_2SiCl_2$), trichlorosilane ($HSiCl_3$), tetrachlorosilane ($SiCl_4$), iodosilane ($H_3ISi$), diiodosilane ($H_2I_2Si$), triiodosilane ($HI_3Si$), or tetraiodosilane ($I_4Si$). In some embodiments, the silicon-containing precursor includes bis (diethylamino) silane (BDEAS).

In one or more embodiments, the silicon precursor can be co-flowed with an inert, diluent or carrier gas such as nitrogen, argon, hydrogen and helium. In some embodiments, the silicon precursor is co-flowed with one or more of argon or helium.

In some embodiments, the reactant gas comprises one or more of Ar, He, $H_2$ or $N_2$. The reactant gas and silicon precursor can be co-flowed into the plasma processing chamber in a plasma enhanced chemical vapor deposition (CVD) process. In one or more embodiments, the deposition reactant gas comprises a plasma that is exposed to the showerhead concurrently with the silicon precursor in a plasma-enhanced CVD process. The oxygen-containing gas is selected from the group consisting of $O_2$, $N_2O$, $O_3$ and $H_2O$ and combinations thereof. In one or more embodiments, the oxygen-containing gas consists essentially of or consists of $N_2O$. When the reactant gas is an oxygen-containing gas, the thin film 106 formed on the lower surface 143 and that lines the gas openings 142 is a silicon oxide thin film, for example silicon dioxide ($SiO_2$).

The reactant gas and silicon precursor can be co-flowed into the plasma processing chamber in a plasma enhanced chemical vapor deposition (CVD) process. In one or more embodiments, the deposition reactant gas comprises a plasma that is exposed to the showerhead concurrently with the silicon precursor in a plasma-enhanced CVD process. The nitrogen-containing gas is selected from the group consisting of nitrogen ($N_2$), ammonia ($NH_3$) and mixtures thereof.

The reactant gas containing nitrogen can include a mixture of other gases such as hydrogen ($H_2$) and an inert gas selected from the group consisting of argon (Ar), and helium (He). Examples of suitable gas mixtures for the reactant gas containing nitrogen include $Ar/N_2$, $He/N_2$, $Ar/NH_3$, $He/NH_3$, $He/N_2/NH_3$, $Ar/N_2/NH_3$, $Ar/H_2/N_2$, and $Ar/H_2/N_2$.

In some embodiments, the plasma comprises one or more of Ar, He, $H_2$ or $N_2$. In some embodiments, the plasma consists essentially of Ar. In some embodiments, the plasma consists essentially of He. In some embodiments, the plasma consists essentially of $H_2$. In some embodiments, the plasma consists essentially of $N_2$. As used in this manner, the term "consists essentially of" means that the plasma is greater than or equal to about 95%, 98% or 99% of the stated species on an atomic basis.

Referring now to FIGS. 3A-F, a method of treating a plasma showerhead is illustrated. First referring to FIG. 3A, the method of treating a showerhead comprises placing a faceplate 111 comprising a lower surface 143 and a plurality of gas openings 142 in the lower surface 143 in a plasma processing chamber (for example, the plasma processing chamber 100 shown in FIG. 1) above a substrate support 116 so that there is a space defining a process volume 121 between the substrate support 116 and the lower surface 143. The method continues by exposing the showerhead including the faceplate 111 comprising the lower surface 143 and the plurality of gas openings 142 to a gas mixture (labeled "G" in FIG. 3A) comprising silicon-containing precursor and a reactant gas containing one or more of oxygen and nitrogen so that the process volume and the gas openings are filled with the silicon-containing precursor and the reactant gas. Prior to step 3B, an optional step may include flowing a concentration-reducing purge gas may be flowed to reduce the concentration of the silicon-containing precursor in the gas mixture G.

Figures 3A, 3B, 3C, 3D, 3E, 3F:
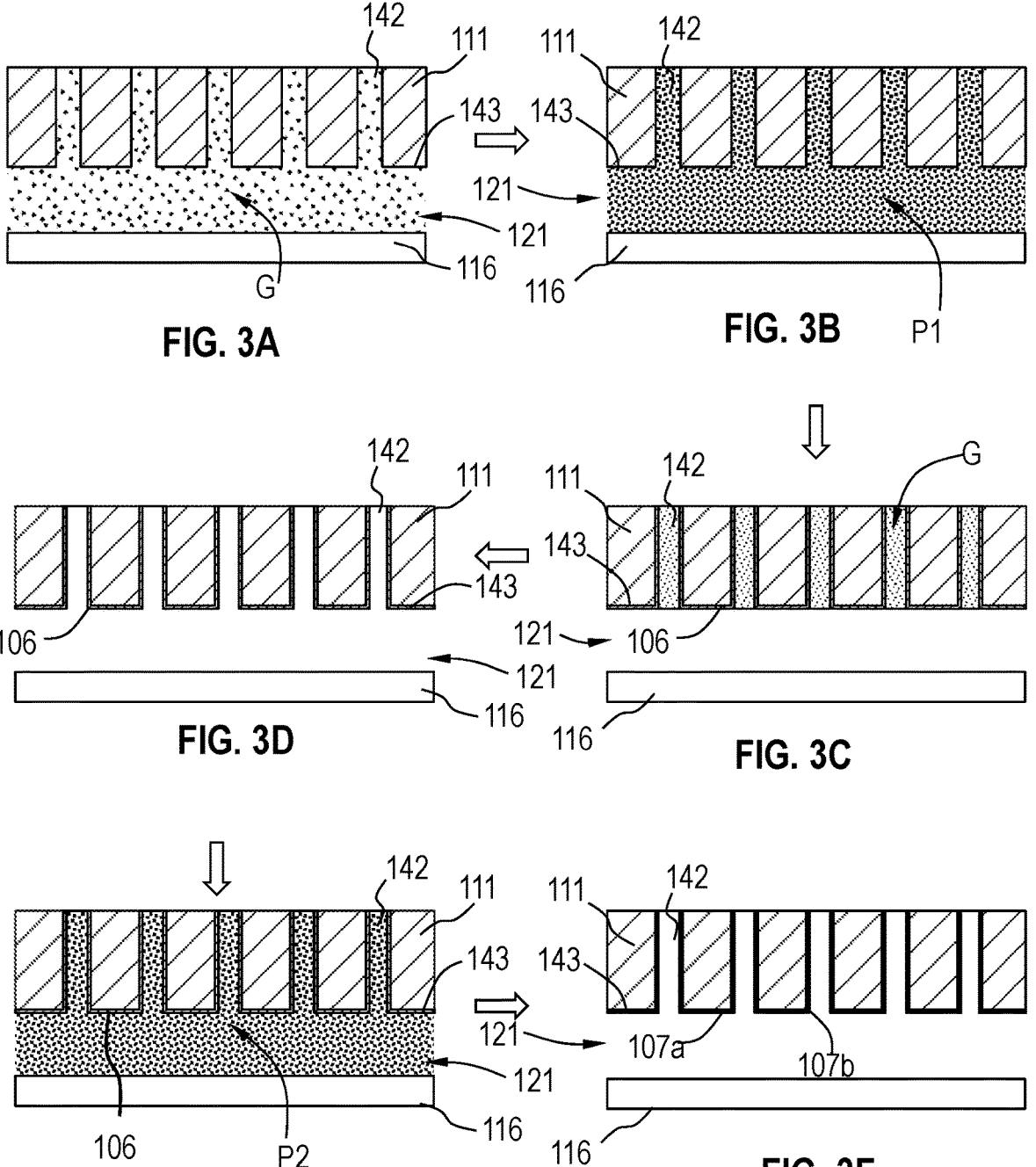
FIG. 3A illustrates a first step of a method for treating the showerhead according to one or more embodiments of the disclosure.
FIG. 3B illustrates a second step of a method for treating the showerhead according to one or more embodiments of the disclosure.
FIG. 3C illustrates a third step of a method for treating the showerhead according to one or more embodiments of the disclosure.
FIG. 3D illustrates a fourth step of a method for treating the showerhead according to one or more embodiments of the disclosure.
FIG. 3E illustrates a fifth step of a method for treating the showerhead according to one or more embodiments of the disclosure.
FIG. 3F illustrates a sixth step of a method for treating the showerhead according to one or more embodiments of the disclosure.

Referring now to FIG. 3B, the method continues as shown by the hollow arrow between FIG. 3A and 3B by introducing a first plasma (labeled P1) in FIG. 3B in the plasma processing chamber for a time sufficient to form a thin film selected from the group consisting of a silicon oxide thin film and a silicon nitride thin film 106 on the lower surface 143 and lining the gas openings 142. FIG. 3C shows the thin film 106 covering the lower surface 143 and lining the gas openings 142 in the faceplate 111. FIG. 3C shows some of the gas mixture G that did not react or form the thin film remaining in the gas openings 142. FIG. 3D shows the process after a precursor-removing purge gas as described above has been flowed to remove any of the gas mixture residue, particularly, silicon-containing precursor, that remains inside the gas openings. The step of flowing the precursor-removing purge gas to remove the silicon-containing precursor from the process volume and the gas openings 142 ensures that the thickness of the thin film that lines the gas openings 142 is not too thick at the conclusion of method. After flowing the precursor-removing purge gas, as shown at FIG. 3E, a second plasma P2 is introduced into the PECVD chamber after flowing the purge gas to remove the silicon-containing precursor and the reactant gas from the process volume and the gas openings. Introducing the second plasma P2 densifies the thin film 106 to form the final densified thin film that covers the lower surface 143 and a thin film 106b that lines the gas openings 142. In some embodiments, the thin film 106a on the lower surface of the faceplate has a thickness that is greater than a thickness of the thin film 106b lining the gas openings 142.

It will be understood that "introducing a first plasma" and "introducing a second plasma" can include striking a plasma using a remote plasma source outside the plasma processing chamber and delivering the remotely generated plasma to the plasma processing chamber or striking the plasma in the plasma processing chamber to introduce the plasma into the process area of the chamber.

According to one or more embodiments the plasma processing chamber during the PECVD process is maintained at a pressure in a range of from about 0.5 Torr to about 10 Torr, for example from about 0.5 Torr to 5 Torr. The temperature in the plasma processing chamber 100 is in range of from about 25° C. to about 550° C., about 25° C. to about 500° C., about 25° C. to about 450° C., from about 25° C. to about 350° C., about 25° C. to about 300° C., about 25° C. to about 250° C. The microwave plasma power is in a range of from 500 W to 4 KW. The precursor is flowed in range of from 1 sccm to 500 sccm and the reactant gases are flowed in range of from 1 sccm to 5000 sccm. According to one or more embodiments, the target thickness of the thin film 106a and 106b is in range of from 100 Angstroms to less than 4 μm, 100 Angstroms to 3.5 μm, 100 Angstroms to 3 μm, 100 Angstroms to 2.5 μm, 100 Angstroms to 2 μm, 100 Angstroms to 1.5 μm, 100 Angstroms to 1 μm, 100 Angstroms to 0.9 μm, 100 Angstroms to 0.8 μm, 100 Angstroms to 0.7 μm, 100 Angstroms to 0.6 μm, 100 Angstroms to 0.5 μm, 100 Angstroms to 0.4 μm, 100 Angstroms to 0.3 μm, or 0.05 um to 0.4 μm on the showerhead.

In a specific embodiment, the gas mixture comprising a silicon-containing precursor and a reactant gas is flowed for a range of from 10 milliseconds to 500 milliseconds, for example 10 milliseconds to 400 milliseconds, 10 to 300 milliseconds or 10 milliseconds to 200 milliseconds. In some embodiments, prior to introducing the first plasma, the method may include a short pre-purge of flowing a concentration-reducing purge gas from 50 to 150 milliseconds, for example 80 to 120 milliseconds.

As discussed above and as shown in FIG. 2, by utilizing a conventional plasma process without pausing between the first plasma and the second plasma and utilizing a purge between application of the first plasma P1 and the second plasma P2, the thickness of the thin film 106 lining the gas openings 142 will be unacceptably thick, in a range of greater than 4 μm to 10 μm or greater. According to one or more embodiments, the PECVD process is a "pulsed PECVD" process, utilizing a microwave plasma to precisely control the thickness of the thin film 106b lining the gas openings 142 to less than 1 μm, and in a range of from 100 Angstroms to 1 μm. The purge gas flowed after the first plasma P1 is flowed in a range of from 100 milliseconds to 5000 milliseconds, for example, 1000 to 1500 milliseconds or 1500 to 3000 milliseconds.

The first plasma P1 is introduced for a relatively short period of time, for example in a range of from 50 milliseconds to 200 milliseconds, for example 80-120 milliseconds or 100 milliseconds, which controls the thickness of the thin film 106b lining the gas openings 142 as well as the thin film 106a on the lower surface 143.

Advantageously, the methods described according to one or more embodiments provide an aluminum oxide showerhead with a silicon-containing thin film the maintains metal contamination in a microwave plasma chamber at less than $1E^{10}$ atoms/cm$^2$ using inductively coupled plasma mass spectroscopy (ICP MS) and defects per 300 mm circular wafer <at less than 7 at 26 nm bin size. An aluminum oxide showerhead without a thin film that is directly exposed microwave plasma results in high aluminum (>400E$^{10}$ atoms/cm$^2$) and Mg (>1E$^{10}$ atoms/cm$^2$) metal contamination, and thin film with silicon-containing film (e.g., $Si_xN_y$ or $SiO_2$) on the showerhead faceplate and gas openings reduces the metal contamination generated when the showerhead is exposed to a microwave plasma to acceptable levels. As discussed herein, microwave plasma has high plasma density and also the microwave plasma penetrates the gas openings 142. Existing PECVD thin film processes in which the using a plasma-enhanced CVD (PECVD) process utilizing a constant flow of a silane and a reactant gas containing oxygen (e.g., $O_2$) or nitrogen (e.g., $N_2$) to form a thin film caused a thick layer of coating in the gas openings 142. It was discovered that a thick coating inside gas openings 142 caused excessive metal particle contamination due to film stress, and thermal expansion coefficient mismatch with the showerhead material. Embodiments of the present disclosure provide a uniform thin film inside gas openings 142 and on the lower surface 143 of the faceplate 111, which reduced the defects caused by the coatings formed by existing processes.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of treating a plasma showerhead, the method comprising:

placing a showerhead comprising a faceplate having a lower surface and a plurality of gas openings in the faceplate in a plasma processing chamber above a substrate support so that there is a space defining a process volume between the substrate support and the faceplate;

exposing the showerhead comprising the faceplate and the plurality of gas openings to a gas mixture comprising a silicon-containing precursor having a gas concentration and a reactant gas containing one or more of oxygen and nitrogen so that the process volume and the gas openings are filled with the silicon-containing precursor and the reactant gas;

flowing a concentration-reducing purge gas for a first period of time to reduce the gas concentration of the silicon-containing precursor in the gas openings;

introducing a first microwave plasma in the plasma processing chamber for a time sufficient to form a silicon oxide thin film on the lower surface of the faceplate and lining the gas openings;

flowing a precursor-removing purge gas for a second period of time longer than the first period of time to remove any remaining silicon-containing precursor from the process volume and the gas openings; and introducing a second plasma in the plasma processing chamber to densify the thin film on the lower surface of the faceplate and lining the gas openings.

2. The method of claim 1, wherein the concentration-reducing purge gas is flowed for a time period in a range of from 10 to 500 milliseconds to reduce the concentration of silicon-containing precursor in the gas openings after the process volume and the gas openings are filled with the silicon-containing precursor.

3. The method of claim 1, wherein the precursor-removing purge gas is flowed for a time period in a range of from 10 to 5000 milliseconds.

4. The method of claim 1, the thin film lining the gas openings has a thickness that is equal to or less thana thickness of the thin film on the lower surface of the faceplate.

5. The method of claim 1, wherein the first plasma and the second plasma are generated by a microwave plasma source.

6. The method of claim 1, wherein the first plasma and the second plasma operate at a frequency greater than 300 MHz and less than 30 GHz.

7. The method of claim 6, wherein the first plasma and the second plasma are operated at a microwave plasma power in a range of from 500 W to 4 kW.

8. The method of claim 1, wherein the method comprises a pulsed PECVD process.

9. The method of claim 1, further comprising repeating the exposing the showerhead to the silicon-containing precursor and the reactant gas, introducing the first plasma, flowing the precursor-removing purge gas and introducing the second plasma to achieve a target thin film thickness.

10. The method of claim 1, wherein the thickness of the thin film on the lower surface of the faceplate and lining the gas openings is in a range of 100 Angstroms to less than 4 μm.

11. The method of claim 1, the silicon-containing precursor is selected from the group consisting of a silane ($Si_xH_y$), a chlorosilane ($Si_xH_yCl_z$), or an iodosilane ($Si_xH_yI_z$).

12. The method of claim 1, wherein the reactant gas is an oxygen-containing gas selected from the group consisting of $O_2$, $N_2O$, $O_3$ and $H_2O$, and the thin film is a silicon oxide thin film.

13. The method of claim 1, wherein the reactant gas is a nitrogen-containing gas is selected from the group consisting of nitrogen ($N_2$), ammonia ($NH_3$) and mixtures thereof, and the thin film is a silicon nitride thin film.

14. The method of claim 1, wherein the plasma processing chamber is maintained at a pressure in a range of from 0.5 Torr to 10 Torr.

15. The method of claim 1, wherein the plasma processing chamber is maintained at a temperature in a range of from about 25° C. to about 550° C.

* * * * *